(12) United States Patent
Pugel et al.

(10) Patent No.: US 7,668,519 B2
(45) Date of Patent: Feb. 23, 2010

(54) TUNER INPUT FILTER WITH ELECTRONICALLY ADJUSTABLE RESPONSE FOR ADAPTING TO ANTENNA CHARACTERISTIC

(75) Inventors: Michael Anthony Pugel, Noblesville, IN (US); Kumar Ramaswamy, Plainsboro, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 1189 days.

(21) Appl. No.: 10/512,525

(22) PCT Filed: Apr. 25, 2003

(86) PCT No.: PCT/US03/12925

§ 371 (c)(1),
(2), (4) Date: Oct. 26, 2004

(87) PCT Pub. No.: WO03/092160

PCT Pub. Date: Nov. 6, 2003

(65) Prior Publication Data

US 2005/0237389 A1    Oct. 27, 2005

Related U.S. Application Data

(60) Provisional application No. 60/376,128, filed on Apr. 26, 2002, provisional application No. 60/376,127, filed on Apr. 26, 2002.

(51) Int. Cl.
*H04B 1/16* (2006.01)

(52) U.S. Cl. .............. 455/180.4; 455/191.2; 455/193.3; 455/266

(58) Field of Classification Search .............. 455/180.4, 455/191.2, 193.3, 266; 334/1, 14
See application file for complete search history.

(56) References Cited

U.S. PATENT DOCUMENTS 4,291,290 A * 9/1981 Ijichi et al. ..................... 334/1

(Continued)

FOREIGN PATENT DOCUMENTS

EP          0475705          3/1992

(Continued)

OTHER PUBLICATIONS

Search Report Dated Aug. 11, 2003.

*Primary Examiner*—Edward Urban
*Assistant Examiner*—Junpeng Chen
(74) *Attorney, Agent, or Firm*—Robert D. Shedd; Joseph J. Opalach; Brian J. Cromarty (57) ABSTRACT

A system, apparatus and/or method provides frequency response adjustment of an RF input filter of an RF tuner based on impedance of an antenna system that is providing reception of RF signals to the RF tuner. The frequency response adjustment is preferably accomplished dynamically and/or with respect to each frequency tuned. Particularly, the system, method and/or apparatus provides compensation at the RF tuner level for mistuning effects produced on the RF tuner by antenna system impedance presented at the antenna input that is other than a designed for impedance. Frequency response of an RF input filter for the RF tuner is electronically adjustable with an independent or semi-independent control voltage signal based on one or more measured parameters of a tuning frequency. Frequency response adjustment may include adjustment of a center frequency of the RF input filter bandpass frequency range and/or altering the bandpass frequency range of the RF input filter. The subject invention expands the capability of an RF signal receiver, particularly one using at least one electronically adjustable RF filter at the input of an electronic alignment type tuner.

4 Claims, 7 Drawing Sheets

U.S. PATENT DOCUMENTS

| | | |
|---|---|---|
| 4,349,840 A | 9/1982 | Henderson |
| 4,404,686 A * | 9/1983 | Moon ................... 455/191.2 |
| 4,584,544 A * | 4/1986 | Hettiger ................. 333/174 |
| 4,736,456 A | 4/1988 | Maier |
| 4,736,457 A * | 4/1988 | Kupfer ................. 455/188.1 |
| 4,907,292 A | 3/1990 | Leipert |
| 4,972,509 A * | 11/1990 | Maejima ............... 455/180.1 |
| 5,715,531 A | 2/1998 | Liu et al. |
| 6,111,603 A | 8/2000 | Zhang et al. |
| 6,226,503 B1 * | 5/2001 | Yamamoto et al. ....... 455/180.4 |
| 6,291,924 B1 | 9/2001 | Lau et al. |
| 6,466,114 B1 * | 10/2002 | Alexandersson ............ 334/14 |

FOREIGN PATENT DOCUMENTS

| | | | | |
|---|---|---|---|---|
| GB | 2276786 A | * | 10/1994 |
| JP | 03038107 A | * | 2/1991 |
| JP | 4-297136 | * | 10/1992 |
| JP | 07131276 A | * | 5/1995 |
| JP | 9-074318 | * | 3/1997 |
| JP | 2000-151448 | * | 5/2000 |
| JP | 2000-183813 A | | 8/2000 |
| JP | 2001-44793 A | | 2/2001 |
| JP | 2001-313580 | * | 11/2001 |

* cited by examiner

TUNER INPUT FILTER WITH ELECTRONICALLY ADJUSTABLE RESPONSE FOR ADAPTING TO ANTENNA CHARACTERISTIC

This application claims the benefit, under 35 U.S.C. § 365 of International Application PCT/U.S. 03/12925, filed Apr. 25, 2003, which was published in accordance with PCT Article 21(2) on Nov. 6, 2003 in English and which claims the benefit of U.S. Provisional Patent Application Nos. 60/376, 128, filed Apr. 26, 2002 and 60/376,127, filed Apr. 26, 2002.

CROSS REFERENCE TO RELATED APPLICATIONS

Cross reference is made to related U.S. patent application Ser. No. 10/512,675 entitled Tuner Input Filter With Electronically Adjustable Center Frequency For Adapting To Antenna Characteristic by Michael Anthony Pugel, Gary Dean Grubbs, Edward Allen Hall, and Max Ward Muterspaugh, filed on even date herewith.

BACKGROUND

1. Field of the Invention

The present invention relates to tuners for radio frequency signal receivers such as televisions and, more-particularly, to a radio frequency tuner with an input filter having electrically adjustable frequency characteristics base on antenna input characteristics.

2. Background Information

Most, if not all, radio frequency (RF) signal receivers, such as radios, televisions, television signal receivers, and the like, include a tuner for selecting a particular radio frequency from the spectrum of available radio frequencies that are input to the RF signal receiver. The RF signal is supplied to the receiver by an antenna and/or cabling.

Tuner RF input circuits for RF signal receivers, particularly television signal receivers, are typically designed based on a known, good 75 ohms source such as provided by cable television systems in order to provide a proper expected performance. Many types of television antennas, particularly those of the indoor variety such as what are known as "rabbit ears", are not capable of providing a good 75 ohm source. As such, a television antenna (and associated cabling) may present the tuner with an input impedance that is other than 75 ohms, changes through the frequency band of interest, and which contains a resistive component and a reactive component.

The reactive portion of the input impedance will be absorbed by the section of the RF input circuit of the tuner. The resistive component will, in most cases, cause the input transforming network at the RF filter input to create the incorrect bandwidth base on the loaded Q of the network. The unknown impedance may cause the RF input circuit's center frequency to shift, resulting in a mistuning of the center frequency of the filter. Moreover, the effect of the antenna and associated cabling on the RF tuner input may be to adjust the bandwidth of the RF input circuit due to incorrect resistance in the tuned circuit. Additionally, different input circuits may exhibit an alternate effect, whereas the input reactance causes a change in bandwidth, center frequency, or a combination of both may be present. The result in tuner performance will be lower gain, higher noise figure, poor frequency response, and poor adjacent channel performance. The unknown impedance may also cause other tuning problems.

In RF signal receivers such as televisions, it is known to provide a tuner employing electronic alignment. These tuners use an alignment system that allows for an adjustment range on the RF tuning voltage centered around an oscillator control voltage. Basically, these tuners use voltage controlled RF filters for providing adjustability. When an antenna and cabling are used with respect to such electronic alignment tuners, the effect thereof may be to adjust the tuning of the filter(s) off the desired center frequency and/or bandpass frequency characteristics thereof. This "mistuning" can be seen in varying degrees and in varying modes across the entire input frequency range, and additionally varies in response to the antenna, cable, and type of input filter circuit employed.

It is evident from the above that what is needed is a manner of adjusting for an unknown impedance at the input of an RF tuner of an RF signal receiver.

It is further evident from the above that what is needed is a manner of adjustment of frequency response of an input of an RF tuner of an RF signal receiver based on impedance presented by an RF antenna system through its effects on RF signal reception.

It is yet further evident from the above that what is needed is a manner of dynamic adjustment of frequency response of an input of an RF tuner of an RF signal receiver based on impedance presented by an RF antenna system through its effects on RF signal reception.

SUMMARY

A system, apparatus and/or method provides dynamic frequency response modification and/or adjustment of an RF input filter of an RF tuner with respect to a received RF signal based on impedance of an RF signal receiving antenna.

In one form, there is provided a method for tuning a signal channel comprising the steps of: (a) selecting a signal channel to be tuned; (b) tuning the selected signal channel by applying a control signal to an electronically tunable input filter of the signal tuner, the control signal causing a center frequency of the electronically tunable input filter to correspond to an expected frequency of the signal channel to be tuned; (c) providing an initial control signal to the electronically adjustable filter corresponding to the signal channel to be tuned; (d) measuring a parameter of the tuned signal channel; (e) determining if a frequency response adjustment to the filter is necessary based on the measured parameter; and (f) adjusting the control signal to the electronically adjustable input filter if it is determined that an adjustment is necessary. The frequency response change may be of the form of an adjustment to the center frequency of the filter and/or an adjustment to the filter bandwidth.

BRIEF DESCRIPTION OF THE DRAWINGS

In the drawings.

Corresponding reference characters tend to indicate corresponding parts throughout the several views.

DESCRIPTION OF THE PREFERRED EMBODIMENT(S)

Figure 1:
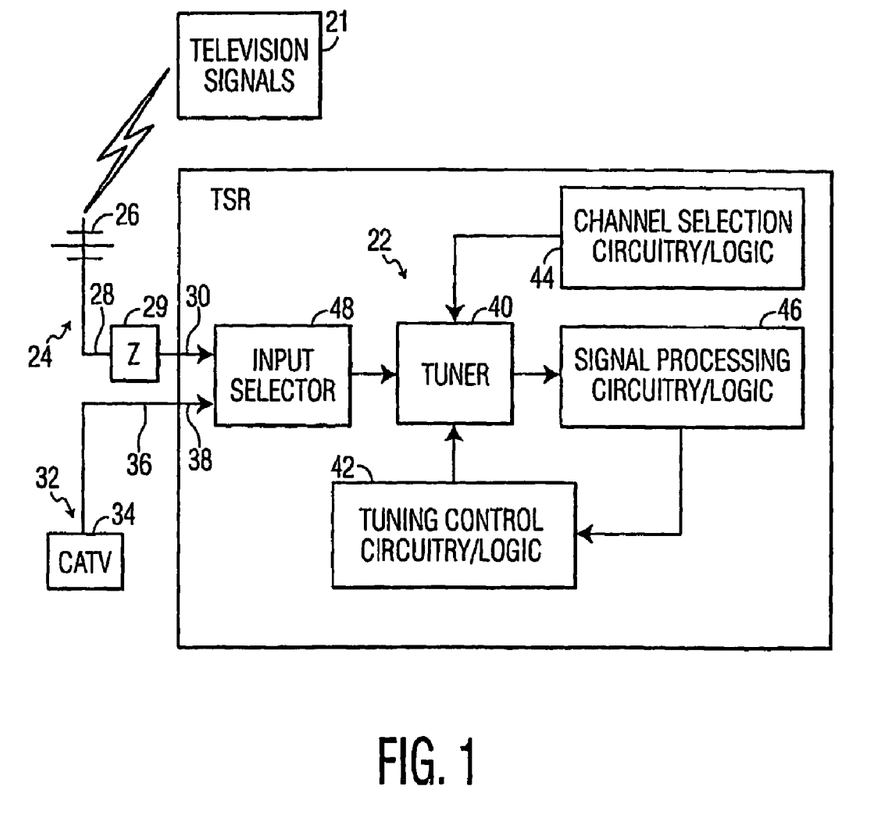
FIG. 1 is a simplified block diagram of an RF signal receiver embodied as a television signal receiver having an exemplary RF tuning system incorporating an electronically adjustable RF input filter in accordance with the principles of the subject invention.

Referring now to FIG. 1, there is depicted a block diagram of an RF signal receiver 20 to which the subject invention pertains. The RF signal receiver 20 is preferably, but not necessarily, of the type that accepts connection to an antenna of an unknown impedance by the user for RF signal reception rather than utilizing a fixed, known impedance antenna. The RF signal receiver 20 may be, and thus is representative of, any type of RF signal receiver such as a television, radio, VCR, television signal receiver, cellular phone, wireless local area network, or the like, to which a user may attach an antenna and typically an external antenna for receiving the RF signals. In the following description of an exemplary embodiment of the invention, a television receiver is described as a representative example of a system suitable for incorporating principles of the invention. However, the principles discussed herein in the context of a television receiver apply to any form of RF signal receiver. More specifically, in the following description of the subject invention, an RF signal receiver will be described as a television or television signal receiver (TSR) that receives television signals typically in the form of television channels (i.e. television signals of different frequencies). It should be appreciated, however, that the subject invention may be utilized with all types of RF signal receivers including, but not limited to, the types of signal receivers identified above that select various types of signal channels including, but not limited to, television channels, radio channels, wireless network connection channels, cellular phone channels, etc.

The television 20 includes a first signal input 30 that is operative, adapted and/or configured to be connected to an antenna system 24. The antenna system 24 includes an antenna 26 and associated cabling 28. The cabling 28 is attached to the antenna 26 and to the antenna input 30 for providing the television signals 21 received by the antenna 26 to the television 20. The antenna 22 may be of any type that is adapted, configured and/or operative to receive television signals and may be an indoor or an outdoor antenna. An example of an indoor antenna may be what is known as a "rabbit ears" type antenna. In all cases, the antenna system 24 receives television signals 21 that are transmitted or broadcast over the air.

Moreover, the antenna 26 may be for analog and/or digital television signals. The antenna system 24 provides an unknown impedance Z (represented by the box 29) consisting of unknown resistive and/or reactive components. The impedance 29 is thus presented to the antenna input 30. This impedance from the antenna is likely a variation from the nominal 75 ohms and likely will be different in some respect for every channel received by the tuner.

The television 20 also includes a second signal input 38 that is operative, adapted and/or configured to be connected to a cable television (CATV) system 32. The CATV system 32 includes a CATV provider or headend 34 providing a plurality of television signals and cabling 36. The cabling 36 connects the CATV 34 to the second input 38. The CATV system 32 provides a known or nominal impedance, typically 75 ohms. In accordance with the principles of the subject invention, the tuning system 22, and particularly the RF tuner 40, is designed based on the known, good 75 ohm source provided by the CATV system 32 and cabling therefore. It should be appreciated that the television 20 may have more television signal inputs.

The first (antenna) input 30 and the second (CATV) input 38 are connected to an input selector 48. The input selector 48, typically known as an RF switch, is operative, adapted and/or configured to select either the antenna input 30 or the CATV input 38 (or any other television signal input the television may have). The television 20 will then provide the television channels of the selected input. Alternatively, another embodiment may not include this input selector, but rather allow only one connection of either a cable or an antenna, The tuner is reprogrammed accordingly through user controls depending on whether an antenna is connected or a cable is connected to this common input.

If the antenna input 30 is selected, the input impedance 29 is thus presented to the television and more particularly to a tuning system 22 of the television. As indicated herein, such impedance varies from nominal values and thus changes the frequency response of the tuning system 22, thereby changing its tuning performance.

The RF signal receiver 20 includes an RF signal tuning system (tuning system), generally designated 22, that is operative, adapted and/or configured to receive a plurality of television (TV) signals of varying frequencies and select or tune a particular TV frequency or channel therefrom. The tuning system 22 includes a tuner 40 that is operative, configured and/or adapted to tune to a particular television channel in response to selection of a particular television channel typically via user input. To this end, the television signal receiver 20 includes channel selection circuitry/logic 44 that is operative, adapted and/or configured to receive a channel selection request and provide the requisite signals to the tuner 40 in order for the tuner 40 to tune to the selected channel.

The tuning system 22 further includes signal processing circuitry/logic 46 that receives the tuned television signal from the tuner 40. The signal processing circuitry/logic 46 provides signal processing for the tuned television signal as is known in the art in order to eventually display the video portion of the television channel and reproduce the audio portion thereof. Moreover, in accordance with the principles of the subject invention and as described further below, the signal processing circuitry/logic 46 provides control signals to tuning control circuitry/logic 42 of the tuning system 22. The tuning control circuitry/logic 42 provides a voltage signal or voltage signals to a tunable component or components of the tuner 40 in order to adjust the frequency response thereof in accordance with the principles of the subject invention.

Particularly, the tuning system 22 is operative, adapted and/or configured to provide frequency response adjustment of the tuner 40 based on the impedance 29 of the antenna system 24. Such frequency response adjustment is preferably accomplished dynamically and/or with respect to each frequency (channel) tuned. Particularly, compensation is provided at the tuner 40 for mistuning effects produced on the tuner 40 by the antenna system 24 impedance 29 presented at the antenna input 30. Frequency response of the tuner 40 is electronically adjustable with an independent or semi-independent control voltage signal based on one or more measured parameters of a channel being tuned. Frequency response adjustment may include adjustment of a center frequency, bandpass frequency range and/or altering the bandpass frequency range of the tuner.

Figure 2:
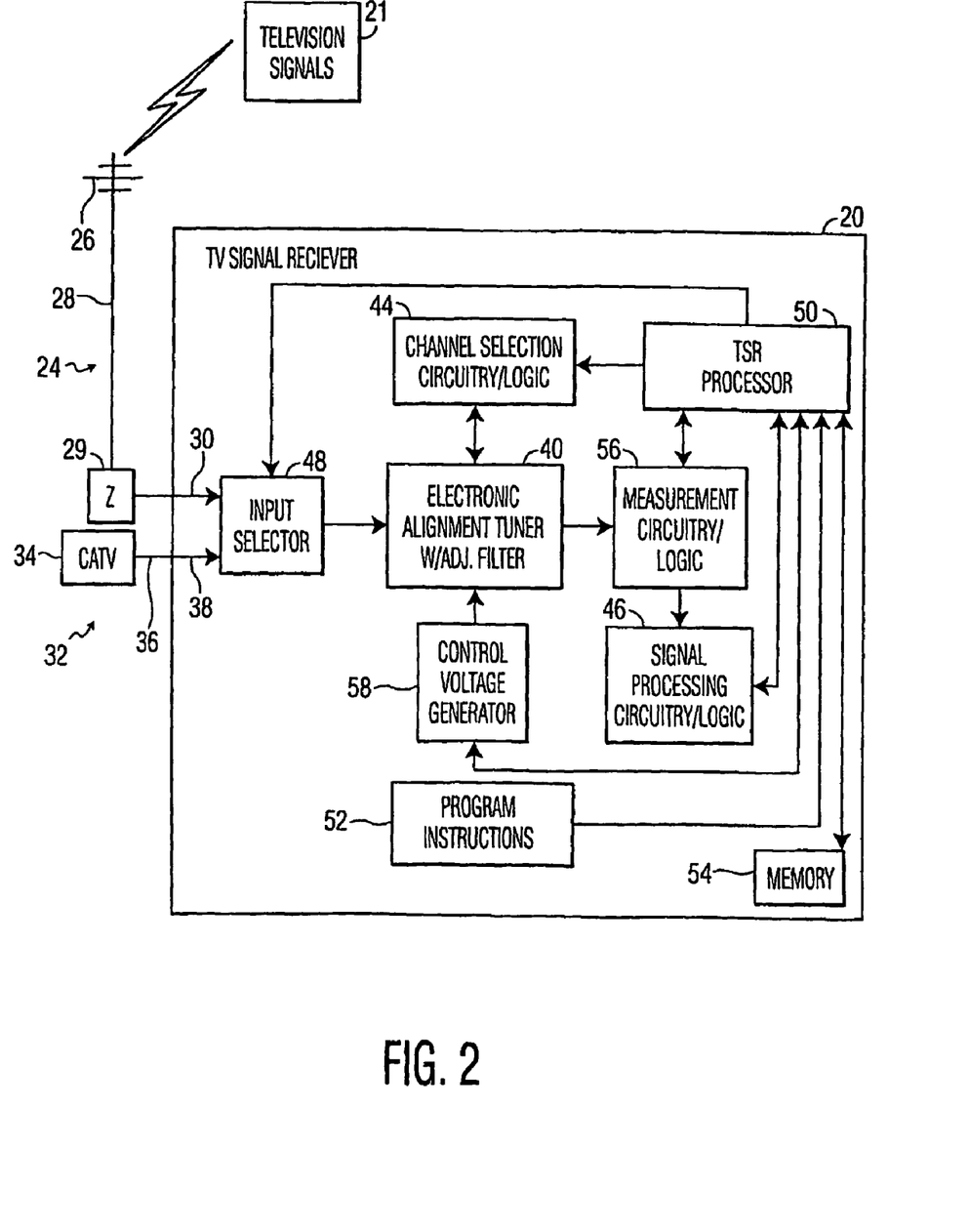
FIG. 2 is a block diagram of an exemplary RF signal receiver embodied as a television signal receiver having a tuning system incorporating an RF input filter wherein frequency response thereof is electronically adjustable in response to input impedance produced as a result of an antenna or antenna system in accordance with the principles of the subject invention.

Referring now to FIG. 2, there is depicted a more detailed block diagram of the exemplary television signal receiver (television) 20 or of another television signal receiver in accordance with the principles of the subject invention. The television 20 of FIG. 2 performs in substantially the same manner as described in conjunction with the embodiment of FIG. 1. The embodiment of FIG. 2, however, provides another manner of implementing the subject invention.

In this embodiment, the tuner 40 is preferably, but not necessarily, a tuner of the type employing electronic alignment. The tuner 40 includes a tunable filter such as an electronically tunable or adjustable filter 16 that utilizes a control signal such as a control voltage signal in order to change the filter or filtering characteristics thereof (i.e. the frequency response thereof such as a range of passband signals or bandpass frequency range and/or a center frequency of the passband frequency range). The tunable filter of the tuner 40 is an input filter, i.e. it is situated at the input of the tuner 40. The tunable filter receives the control voltage from a control voltage generator 58 that may be a digital to analog converter (DAC). The tunable filter of the tuner 40 is tunable in its passband frequency range (bandpass frequency range) depending on the input impedance 29. Particularly, the frequency response of the input filter of the tuner 40 is adjustable in response to the impedance 29. Thus, the passband frequency range and/or a center frequency of the tunable filter may be adjusted. In accordance with the principles of the subject invention, the passband frequency range and/or the center frequency of the tunable filter is with respect to a television channel. In one form, the passband frequency range and/or center channel is dynamically adjusted for each television channel (i.e. accomplished each time a television channel is tuned).

The television 20 includes a processor 50 that provides processing for and/or operation of the various components of the television. The processor 50 executes program instructions 52 in order to provide the functionality and/or features described herein. The television 20 may also include memory 54 such as is known in the art for storing values, preferences, and/or the like. The processor 50 provides control to the channel selection circuitry/logic 44, the signal processing circuitry/logic 46, as well as the control voltage generator 58. The control voltage generator 58 supplies the necessary control voltages to the tuner 40, including the tunable filter thereof for operation in accordance with the present principles. In an exemplary embodiment of the above, the tuning process is for a user to select a channel. The channel Information is then sent to a phase lock loop (PLL) for synthesis of a correct or proper LO, which then generates a tuning voltage which can be used for the RF filters, either directly or indirectly. Then the RF voltages for the filters can be created either directly, indirectly, or independently of the PLL LO tuning voltage.

The determination of whether to initiate adjusting the input filter of the tuner 40 is accomplished, in part, by measurement circuitry/logic 56. The measurement circuitry/logic 56 receives a tuned channel from the tuner 40 and performs a signal measurement or signal measurements thereon, the type of which is determined by whether the television signal is an analog signal or a digital signal. While other metrics may be used, an automatic gain control (AGC) signal may be used for an analog signal, while AGC and/or signal quality may be used for a digital signal.

Figure 3:
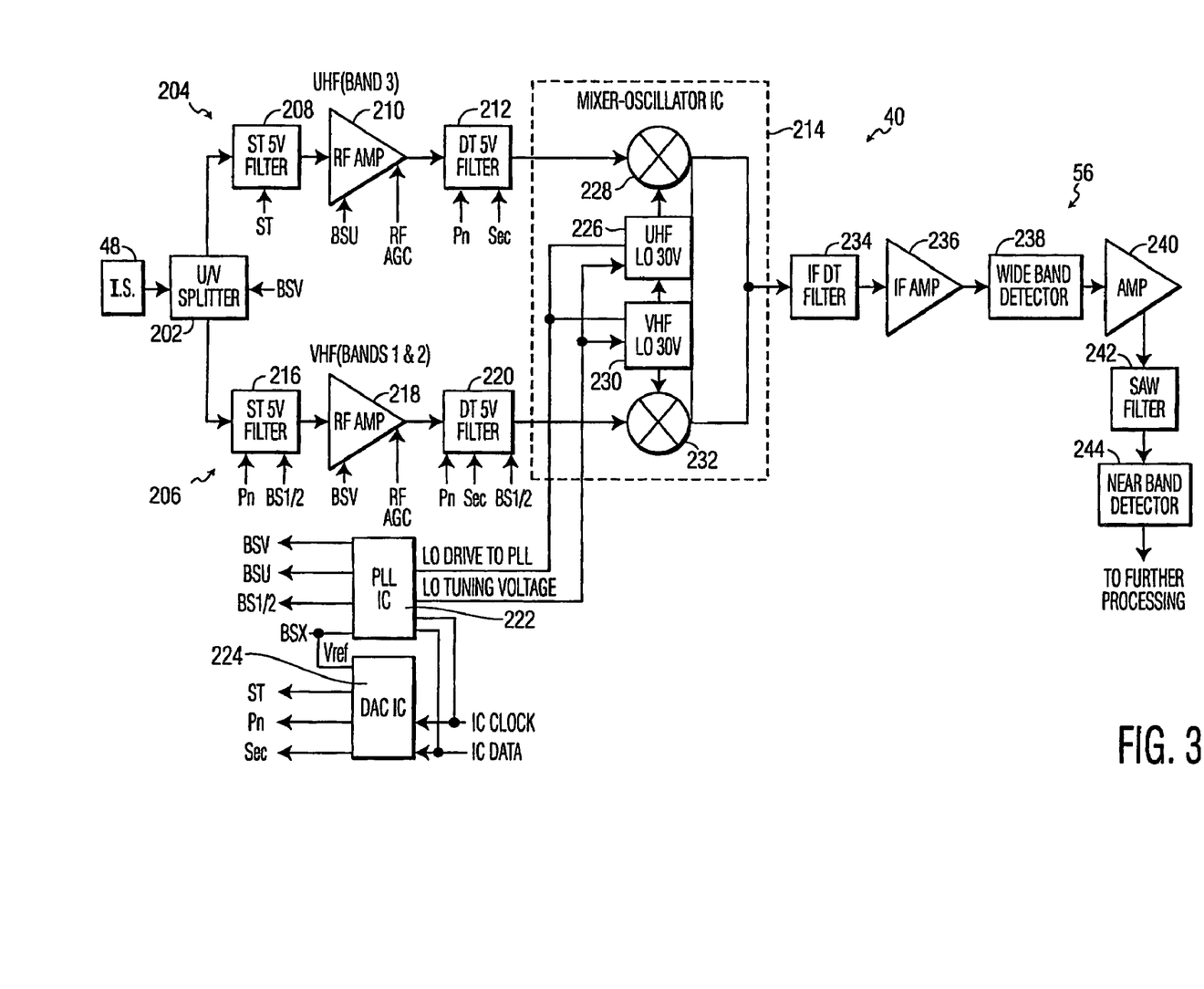
FIG. 3 is a block diagram of an exemplary tuner employing electronic alignment in which the subject invention may be used.

Referring now to FIG. 3, there is depicted a block diagram of an exemplary tuner 40 employing electronic alignment incorporating a tunable input filter in accordance with the principles of the subject invention. The tuner 40 is operative to receive several bands of RF television signals such as VHF (more particularly, two VHF band, band 1 and band 2) and UHF television signals and, according to a selected television channel, provide an IF (intermediate frequency) television channel signal.

The RF signals are received from the input selector 48 that provides television signals (channels) from either the cable system 34 or the antenna system 24. The received television channels are received by a U/V (UHF/VHF) splitter 202 that is operative to separate the UHF band from the VHF bands. The UN splitter 202 receives a control signal BSV (band select VHF) when the selected channel is a VHF band television signal. The control signal BSV is generated by an integrated circuit 222 here shown as an additional function of a phase locked loop (PLL) IC. The control signal BSV is a voltage generated by the PLL 222 in response to a channel selection signal. This may be under control of the processor 50.

The tuner 40 has a UHF processing portion 204, a VHF processing portion 206, a mixer/oscillator portion 214, the PLL 222, and a digital to analog converter (DAC) 224 that may provide a voltage control generator (58) function. The UHF processing portion 204 is operative to tune a particular UHF channel (particular television signal) in response to channel selection. The VHF processing portion 206 is operative to tune a particular VHF channel (particular television signal) within a particular VHF band (here one of two VHF bands) in response to channel selection.

The UHF processing portion 204 includes a single tuned (ST) input filter 208 as an adjustable or tunable input filter in accordance with the present principles that is connected to the U/V splitter 202 so as to receive the output of the U/V splitter 202. Particularly, the UHF signals are received by the tunable input filter 208 from the U/V splitter 202. The tunable input filter 208 operates over a particular voltage range depending on design parameters, particularly a continuous analog voltage. A control voltage signal, designated ST, is received by the tunable input filter 208 that allows the frequency response of the tunable input filter 208 to be adjusted per the present principles. The DAC 224 may use the LO tuning voltage to produce the control voltage for the tunable input filter, with or without a stored offset signal (a semi-independent control voltage signal with regard to the local oscillator, LO) or the control voltage ST may be supplied to the tunable input filter 208 by a voltage generator that is independent of the local oscillator (LO) in response to the channel selection signal. The voltage signal ST allows the single tuned filter 208 to tune the selected channel and be adjustable in its frequency response.

The output of the tunable input filter 208 is provided to an RF amplifier (amp) 210. The RF amplifier 210 is operative to amplify the RF UHF signal from the tunable input filter 208 according to an RF AGC (automatic gain control) signal produced by the television signal receiver. The RF amplifier 210 is also operative to receive a UHF band select signal (BSU) generated by and from the PLL 222. The UHF band select signal BSU is generated by the PLL in response to the channel selection signal. The band select signal BSU is essentially an on/off signal for the RF amplifier 210.

The output of the RF amplifier 210 is provided to a double tuned (DT) filter 212. In this embodiment, the double tuned filter 210 operates over a zero to five (0-5) volt range. It may be appreciated that other techniques may be employed, e.g., variable reactance (e.g., voltage variable reactance or varactor) filter techniques employing voltages similar to and derived more directly from the LO tuning voltage. Particularly, the double tuned filter 210 operates over a continuous analog voltage from zero to five (0-5) volts. A zero to five volt signal, designated PRI, is received from the DAC 224. The DAC 224 produces the zero to five volt signal (i.e. the continuous analog 0-5 volt signal) PRI in response to the channel selection signal. The PRI voltage signal allows the first portion of the double tuned filter 212 to tune the selected channel. A zero to five volt signal, designated SEC, is also received from the DAC 224. The DAC 224 produces the zero to five volt signal (i.e. the continuous analog 0-5 volt signal) SEC in response to the channel selection signal. The SEC voltage signal allows the second portion of the double tuned filter 212 to tune the selected channel.

The output of the double tuned filter 212 is provided to the mixer/oscillator 214, shown in the form of an IC. It should be appreciated that the mixer portion and the oscillator portion may be separate, but is shown combined. In particular, the output of the double tuned filter 212 is provided to a mixer 228. A UHF local oscillator (LO) 226 has an output connected to the mixer 228. The UHF LO 226 is operative to receive a local oscillator (LO) tuning voltage signal from the PLL 222 and generate a tuned local oscillator signal. The LO tuning voltage signal is produced by the PLL in response to the channel selection signal. The LO tuning voltage signal is an analog voltage signal from zero to thirty (0-30) volts. The UHF LO 226 also provides feedback to the PLL 222 in the form of an LO drive signal.

The UHF mixer 228 combines or mixes the tuned UHF local oscillator signal from the UHF LO 226 with the output signal (selected channel) of the double tuned filter 212. The output of the mixer 228 is provided to a double tuned intermediate frequency (IF) filter 234. The double tuned IF filter 234 provides its output to an IF amplifier (amp) 236. The amplified IF signal (selected television channel) from the IF amplifier 236 is then provided to the measurement circuitry/logic 56.

The VHF processing portion 206 includes a single tuned (ST) input filter 216 as an adjustable or tunable filter in accordance with the present principles that is connected to the U/V splitter 202 so as to receive the output of the U/V splitter 202. Particularly, the VHF signals are received by the tunable input filter 216 from the U/V splitter 202. The tunable input filter 216 operates over a particular voltage range depending on design parameters, particularly a continuous analog voltage. A control voltage signal, designated ST, is received by the tunable input filter 216 that allows the frequency response of the tunable filter 216 to be adjusted per the present principles. The DAC 224 may use the LO tuning voltage to produce the control voltage for the tunable input filter 216 with or without a stored offset signal or voltage (a semi-independent control signal with regard to the LO) or the control voltage (ST) supplied to the tunable input filter 216 may be supplied by a voltage generator that is independent of the LO in response to the channel selection signal. The voltage signal ST allows the single tuned filter 216 to tune the selected channel and be adjustable in its frequency response.

Additionally, the tunable input filter 216 is operative to receive a band select signal (BS 1/2) produced by and therefore from the PLL 222. The band select signal (BS 1/2) selects one of two VHF bands. Particularly, band select signal (BS 1/2) is an on/off voltage signal derived from the channel selection signal.

The output of the tunable input filter 216 is provided to an RF amplifier (amp) 218. The RF amplifier 218 is operative to amplify the RF VHF signal from the tunable input filter 216 according to an RF AGC (automatic gain control) signal produced by the television signal-receiver. The RF amplifier 218 is also operative to receive a VHF band select signal (BSV) generated by and from the PLL 222. The VHF band select signal BSV is generated by the PLL in response to the channel selection signal. The band select signal BSV is essentially an on/off signal for the RF amplifier 218.

The output of the RF amplifier 218 is provided to a double tuned (DT) filter 220. The double tuned filter 220 operates over a zero to five (0-5) volt range. Particularly, the double tuned filter 220 operates over a continuous analog voltage from zero to five (0-5) volts. A zero to five volt signal, designated PRI, is received from the DAC 224. The DAC 224 produces the zero to five volt signal (i.e. the continuous analog 0-5 volt signal) PRI in response to the channel selection signal. The PRI voltage signal allows the first portion of the double tuned filter 220 to tune the selected channel. A zero to five volt signal, designated SEC, is also received from the DAC 224. The DAC 224 produces the zero to five volt signal (i.e. the continuous analog 0-5 volt signal) SEC in response to the channel selection signal. The SEC voltage signal allows the second portion of the double tuned filter 220 to tune the selected channel.

Additionally, the double tuned filter 220 is operative to receive the band select signal (BS 1/2) produced by and therefore from the PLL 222. The band select signal (BS 1/2) selects one of two VHF bands. Particularly, band select signal (BS 1/2) is an on/off voltage signal derived from the channel selection signal. The band select signal (BS 1/2) is the same as provided to the single tuned filter 216.

The output of the double tuned filter 220 is provided to the mixer/oscillator 214, shown in the form of an IC. It should be appreciated that the mixer portion and the oscillator portion may be separate, but is shown combined. In particular, the output of the double tuned filter 220 is provided to a mixer 232. A VHF local oscillator (LO) 230 has an output connected to the mixer 232. The VHF LO 230 is operative to receive a local oscillator (LO) tuning voltage signal from the PLL 222 and generate a tuned local oscillator signal. The LO tuning voltage signal is produced by the PLL in response to the channel selection signal. The LO tuning voltage signal is an analog voltage signal from zero to thirty (0-30) volts. The VHF LO 230 also provides feedback to the PLL 222 in the form of an LO drive signal.

The VHF mixer 232 combines or mixes the tuned VHF local oscillator signal from the VHF LO 230 with the output signal (selected channel) of the double tuned filter 220. The output of the mixer 232 is provided to the double tuned intermediate frequency (IF) filter 234. The double tuned IF filter 234 provides its output to the IF amplifier (amp) 236. The amplified IF signal (selected television channel) from the IF amplifier 236 is then provided to the measurement circuitry/logic 56.

The measurement circuitry/logic 56, in addition to other functions, is used to determine the tuning of the respective tunable input filter. The measurement circuitry/logic 56 includes a wide band detector 238 that is operative to ascertain parameters (e.g. AGC, signal strength or the like) of the television signal within a relatively wide a frequency range around the particular frequency of the television channel being tuned. At this point, the received signal probably includes several television channels. This aids in determining whether the signal being received is actually of the frequency of the television channel that should be tuned in response to the channel selection, or of a frequency of an adjacent television channel being tuned. As discussed with respect to a manner of operation of the subject invention, the television 20 ascertains all of the television channels that are being received through the antenna system 24.

Once wide band detection 238 has been accomplished, the television signal is provided to an amplifier (amp) 240. Thereafter, the amplified television signal is provided to a SAW filter 242. The SAW filter 242 attempts to restrict the television signal to a single television channel and reject the adjacent undesired signals. Thereafter, the television signal is provided to a narrow band detector 244. The narrow band detector 244 is operative to ascertain parameters (e.g. AGC, signal strength or the like) of the television signal within a relatively narrow frequency range around the particular frequency of the television channel being tuned. This aids in trying to determine whether the tunable input filter has been optimally tuned to receive the selected television channel. Thereafter, the television signal is provided to further processing.

The channel selection signal is typically, but not necessarily, produced by the television signal receiver having the electronic alignment system in response to user input. The channel selection signal is provided to the DAC 224 and the PLL 222. While other manners of providing the channel selection signal are contemplated, the electronic alignment system 200 is shown utilizing the I²C (or IIC) configuration/protocol. As such, an I²C clock line and an I²C data line is shown connected to the DAC 224 and the PLL 222. Both the PLL 222 and the DAC 224 produce an analog voltage signal continuously ranging from zero (0) to a maximum voltage which, in the case of the DAC 224 is five (5) volts, and in the case of the PLL 222, is thirty (30) volts.

Recapitulating, the television 20 includes an electronically tunable input filter (e.g. 208, 216) as part of the tuner. The tunable input filter is tunable as to a passband frequency range via a control voltage applied thereto. The frequency range and the center frequency of the filter 60 is controlled by varying a control voltage applied thereto. The control voltage is produced in response to a performance measurement or measurements of received television signals as provided herein. In accordance with the principles of the subject invention, this provides compensation at the tuner 40 for the effects of the variations from nominal of impedance 29 that was not considered in the design of the tuner 40.

In accordance with the principles of the subject invention, the tuner 40, under control of the processor 50, is tunable to a particular television channel or channels. The output of the tuner 40 is coupled to measurement circuitry/logic 56. The measurement circuitry/logic 56 is operative, configured and/or adapted to obtain performance measurements (metrics) of the tuned television channel or channels in order to determine whether frequency response adjustment of the tunable input filter in the form of a center frequency adjustment or frequency band or range (bandpass range) needs to be made to the tunable input filter. The measurement circuitry/logic 56 may look at RF AGC (automatic gain control) metrics, signal quality, or otherwise, depending on whether the television signal is analog or digital, as well as other considerations. The measurement(s) are provided to the processor 50 for analysis.

The processor 50 is controlled by the program instructions 52 stored in a memory such as ROM, in order to provide the functionality described herein. The processor 50 obtains signal measurements and determines whether an improvement in signal quality is desired. If it is determined that no improvement in signal quality is necessary, control voltage data previously stored in a memory 54 is used to allow the control voltage generator 58 to provide the desired control voltage to the tunable input filter. This control voltage data is the "nominal" data for the tuner 62 as designed for the 75 ohms CATV input (or other "designed for" signal input system).

If it is determined that an improvement in signal quality is necessary, the processor 50 causes the control voltage generator 58 to adjust the control voltage supplied to the tunable input filter. This changes the filter frequency range thereof and/or the center frequency thereof. Thereafter, new measurement(s) taken. The adjustment in control voltage is preferably made to provide an increment in center frequency of the tunable filter 60 and a decrement in center frequency or frequency range of the tunable input filter (each with respect to the nominal frequency with respect to a 75 ohm CATV input), after which, each time a measurement or measurements are taken. The more optimum control voltage is retained. This process is repeated until a suitable signal quality is obtained, the control is at a preset limit or no further improvement can be obtained.

Once the adjustment is complete, this new control voltage value is stored in the memory 54. The program instructions also allow for re-adjustment for various reasons. It should be appreciated that the blocks depicted in the figures and described above are not necessarily separate components, circuitry or the like, but represent functionality of the television 20. Some blocks may represent actual components of the television.

Figure 4:
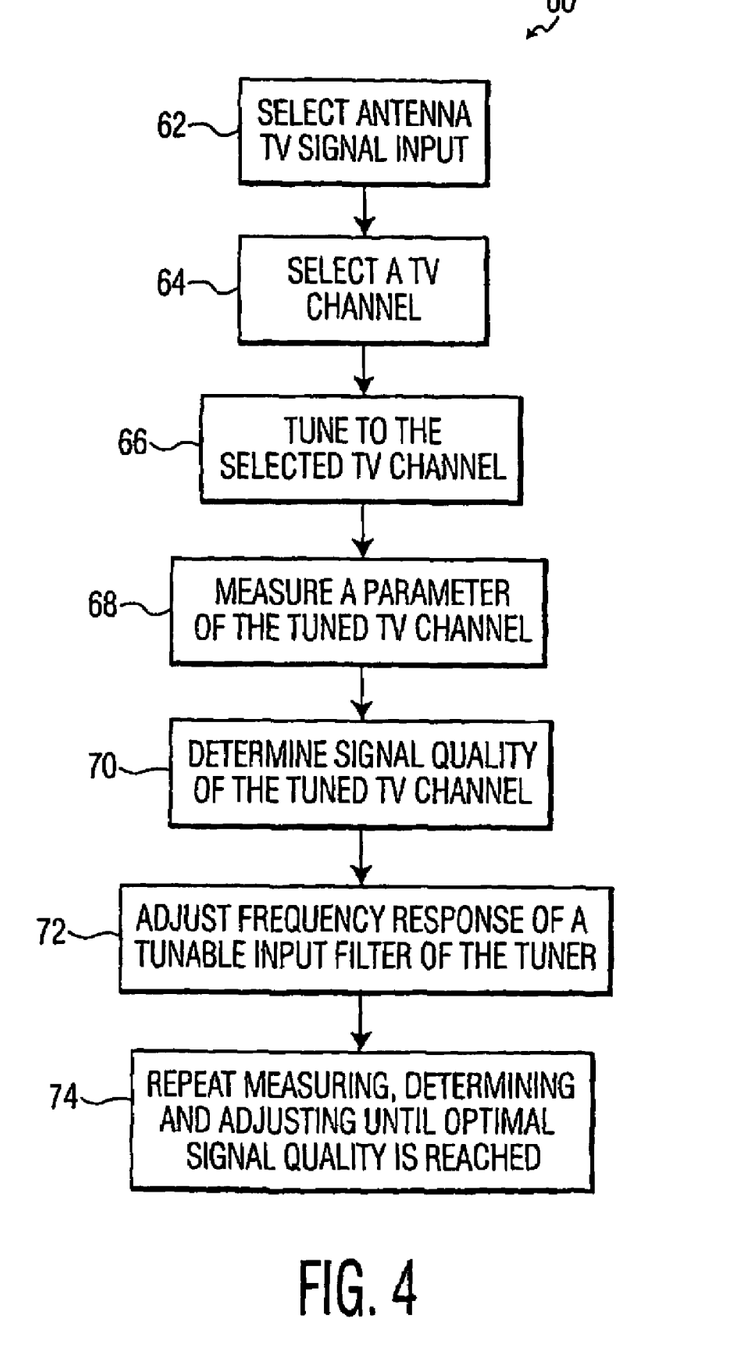
FIG. 4 is a flowchart of an exemplary manner of adjusting the frequency response of the subject RF input filter in response to the presence of impedance at an RF signal input to the RF input filter in accordance with the principles of the subject invention.

Referring now to FIG. 4, there is depicted a flowchart, generally designated 60, of an exemplary manner of providing compensation for impedance at the input to an RF tuner, and particularly the electronic adjustment of the frequency response of an electronically adjustable RF input filter, in accordance with the principles of the subject invention. It should initially be appreciated that while the method described is in connection with a tuner in a television signal receiver (e.g. a television), the subject invention may be utilized by other types of RF signal receivers. The compensation may be adjustment of the center frequency of the tunable input filter or the adjustment of the bandpass frequency range of the tunable input filter.

In block (step) 62 the antenna television signal input is selected. Thereafter, in block 64 a particular television channel is selected. The television, in block 66, then tunes to the selected television channel. After the selected television channel is tuned, in block 68, a parameter of the tuned television channel is measured. In block 70, from the measured parameter of the tuned television channel, signal quality of the tuned television channel is determined.

In block 72, the frequency response of the tunable input filter is adjusted. Thereafter, in block 74, the measuring, determining and adjusting is repeated until an optimal signal quality for the television channel being tuned is reached. Adjustment of the tunable input filter may be such that a frequency response thereof has a center frequency that corresponds to the frequency of the television channel being tuned as shifted by the impedance of the antenna, as compared to the normal frequency for the particular television channel. Adjustment of the tunable input filter may be such that a frequency response thereof has a passband frequency range that includes the frequency of the television channel being tuned as shifted by the impedance of the antenna, as compared to the normal frequency for the particular television channel.

Figure 5:
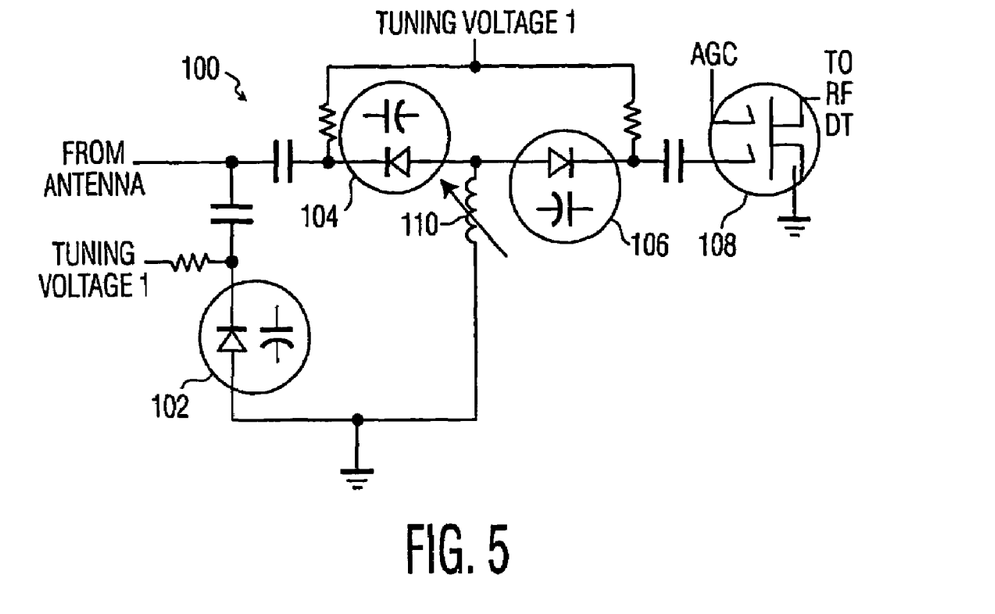
FIG. 5 is a circuit diagram of an exemplary electronically adjustable RF input filter in accordance with one aspect of the subject invention.

Referring now to FIG. 5, there is depicted an exemplary tunable input filter generally designated 100 that may be used as the single tuned filter 208 or 216 of the electronic alignment tuner 40 of FIG. 3. The tunable input filter 100 allows for an Input transformer 110 thereof to be variable. The tunable input filter 100 has a first varactor diode 102 that is provided in a shunt configuration with the antenna input ("From Antenna") and the output of the filter (through the varactor diode 106 and amplifier (field effect transistor) 108). The amplifier 108 provides the AGC and has its output connected to the radio frequency (RF) double tuned (DT) filter. A second varactor diode 104 is provided in series with the antenna and the output of the filter.

Various capacitors and resistors are provided as necessary. This configuration allows for the adjustment of the transform ratio thereof. The same control voltage (Tuning Voltage 1) is provided to the varactor diodes 102 and 104. The control voltage is thus common to both varactors but is still preferably independent of the local oscillator voltage.

Figure 6:
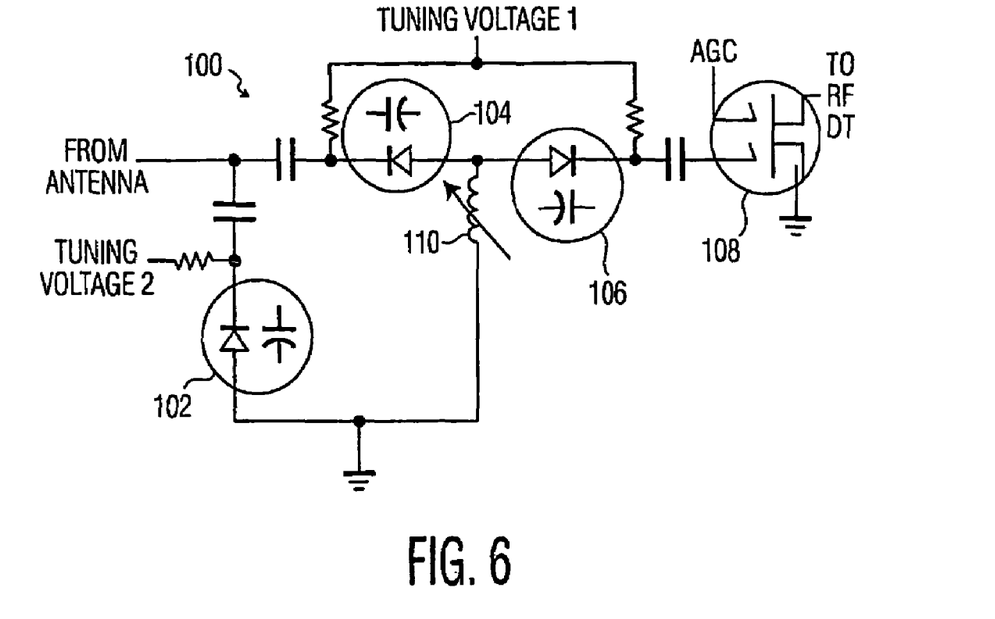
FIG. 6 is a circuit diagram of another exemplary electronically adjustable RF input filter in accordance with one aspect of the subject invention

In FIG. 6, the tunable input filter 100 is shown having the same circuit elements and arrangement as the tunable input filter 100 of FIG. 5. In the tunable filter 100 of FIG. 6, however, separate control voltages are applied to each varactor. Particularly, the tuning voltage 1 as the control voltage is provided to the series varactor 104, while a tuning voltage 2 as a separate control voltage is applied to the shunt varactor 102. This case allows for the continuously variable adjustment of the capacitance of each varactor base on the control voltage which, in turn, allows for the adjustment of both the transform ratio and tuning frequency of the filter.

It should be appreciated that the capacitance values of the varactors should be appropriately chosen for proper operation. One criteria is that the capacitance values be different from one another. Moreover, in order to allow for a significant adjustment range, each diode must possess some excess adjustment range over the nominal operating range.

The above exemplary tunable input filters are operative to provide performance improvement in tuning of the tuner in which they are a part, through adjustment thereof, particularly when off-air reception (antenna) is selected. Particularly, the filters of FIGS. 5 and 6 provide adjustable frequency ranges (frequency response) to compensate for shifts or 'mis-tuning' as a result of off-air antenna impedance on the tuner.

Figure 7:
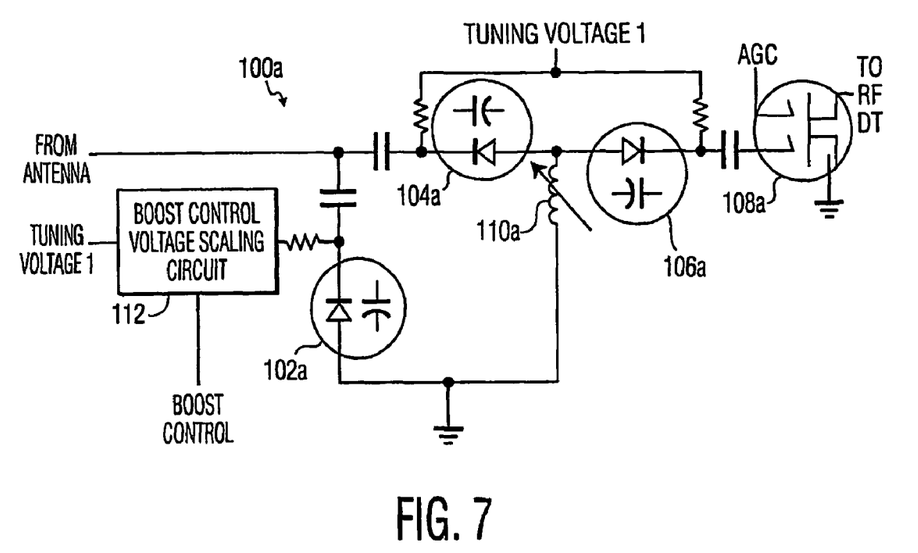
FIG. 7 is a circuit diagram of the exemplary electronically adjustable RF input filter of FIG. 5 incorporating a boost control voltage scaling circuit in accordance with an aspect of the subject invention.

Referring now to FIG. 7, there is depicted an exemplary tunable input filter generally designated 100a that may be used as the single tuned filter 208 or 216 of the electronic alignment tuner 40 of FIG. 3. The configuration of the filter 100a is identical to the configuration of the filter 100 of FIG. 5, with the exception of a boost control voltage scaling circuit 112. The boost control voltage scaling circuit 112 is provided between the tuning voltage 1 and the shunt varactor diode 102a. A boost control signal input is provided to the boost control voltage scaling circuit 112 that provides a boost control signal if desired.

If the boost control voltage scaling circuit 112 is activated by the boost control signal, the shunt control voltage (tuning voltage 1) is passed through the boost voltage scaling circuit 112 that scales (fixedly increments) the voltage downward. The capacitance of the varactor 102a is now larger and allows for a reduction in the transform ratio, increasing the loaded Q and decreasing the bandwidth. The typical formula for this bandwidth relates the ratio of the two capacitors as a bandwidth. Bandwidth is proportional to the sum of (C102 and C104) squared divided by C104 squared. In this case, the filter 100a provides a known bandwidth increase, not an adjustable one as with the filter 100 of FIG. 5.

Figure 8:
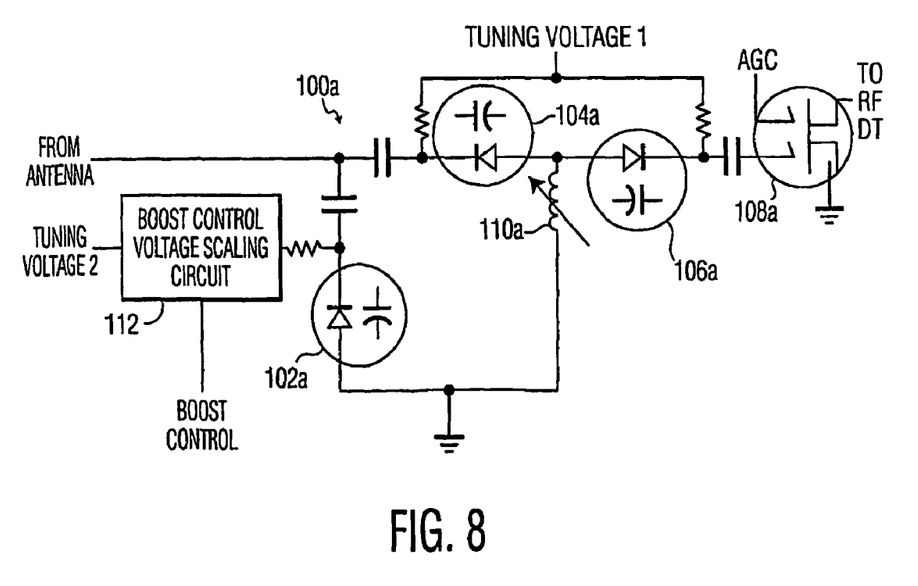
FIG. 8 is a circuit diagram of the exemplary electronically adjustable RF input filter of FIG. 6 incorporating a boost control voltage scaling circuit in accordance with an aspect of the subject invention.

In FIG. 8, the filter 100a uses two control voltages, tuning voltage 1 and tuning voltage 2 in like manner to the filter of FIG. 6. In this configuration, the switched bandwidth is larger than the bandwidth of the filter of FIG. 7.

While the above filters of FIGS. 5-8 may not be used with tuners having electronic alignment, the use of such filters in tuners with electronic alignment or adjustment can now change the control voltage to one or both diodes (depending on which filter is used) to re-center the frequency response (or change the bandwidth and collectively, change the frequency response thereof) with the effectively wider bandwidth. Again, the capacitance values of the diodes must be appropriate for proper operation, but need to be different from each other. In order to allow for a significant adjustment range, each diode must possess some excess adjustment range over the nominal operating range.

Figure 9:
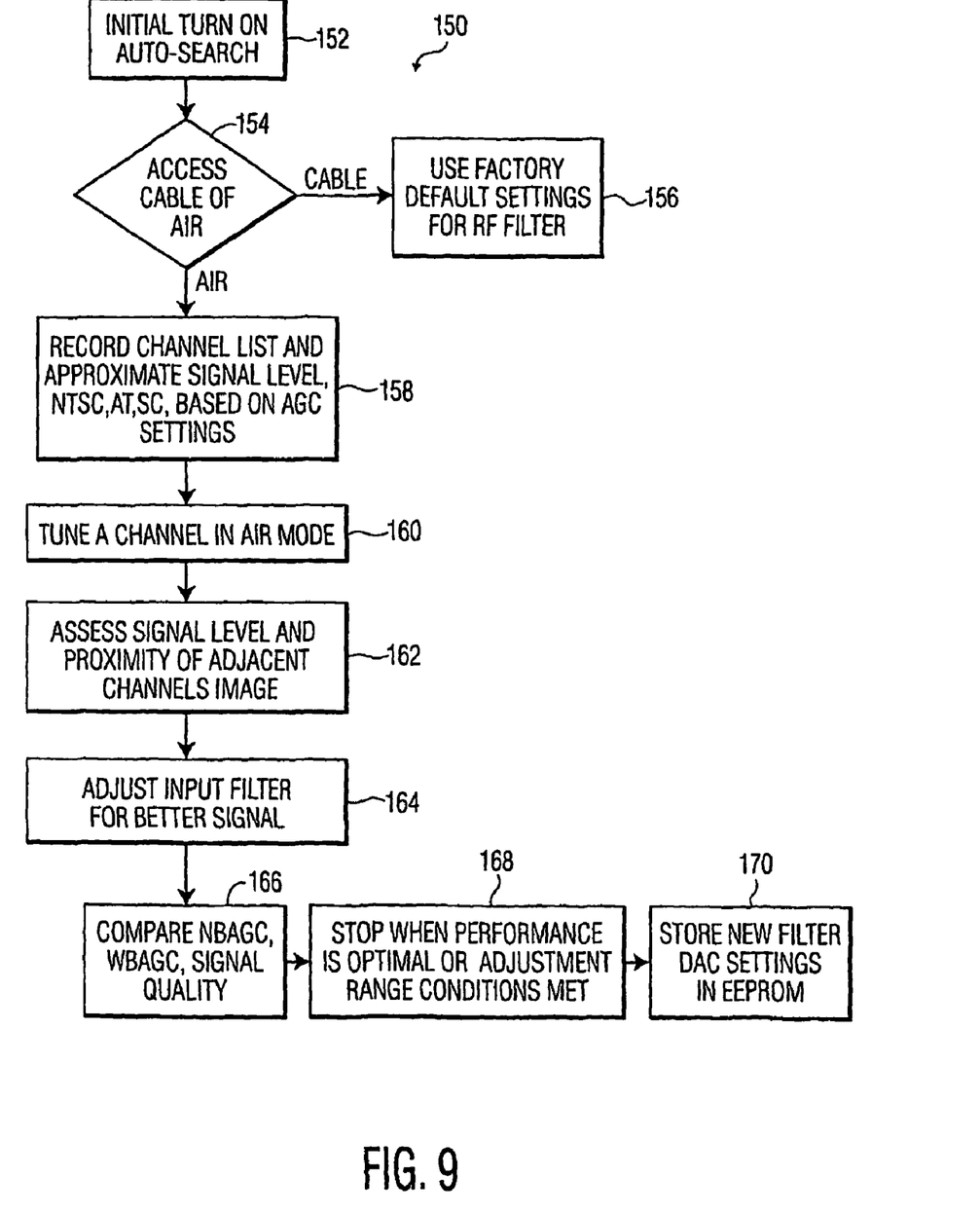
FIG. 9 is a flowchart of another exemplary manner of adjusting the frequency response of the subject RF input filter in response to the presence of impedance at an RF signal input to the RF input filter in accordance with the principles of the subject invention.

Referring now to FIG. 9, there is depicted a flowchart, generally designated 150, of another exemplary manner of providing compensation for impedance at the input to an RF tuner, and particularly the electronic adjustment of the frequency response of an electronically adjustable RF input filter, in accordance with the principles of the subject invention. Such frequency response adjustment may be to the center frequency with respect to the television channel being tuned, or with respect to a bandwidth encompassing the television channel being tuned. It should initially be appreciated that while the method described is in connection with a tuner in a television signal receiver (e.g. a television), the subject invention may be utilized by other types of RF signal receivers.

In block (step) 152, the television is turned on and an auto-search routine is initiated. Because a television is typically connected to only one of an antenna and a cable system, but not both at the same time, the auto-search routine is typically only performed during an initial set-up of the television. However, in the event that the television becomes unconnected to a source of electricity for a period of time (or the electricity is off), the auto-search routine may be initiated again. Once the auto-search routine is initiated, the auto-search routine then assesses, in block 154, whether the television is receiving television channels (signals) via a cable television (CATV) system (i.e. cable) or over the air (i.e. air) via an antenna. While such an assessment may be accomplished in various manners, one such manner is to pick a television signal (antenna or cable) input, attempt to tune to one or more particular television channels, and determine whether valid television signals are present. If the chosen television signal input does not yield any valid television signals, the other television signal input is chosen, with the search and determination scheme renewed. As an alternative routine, the television may prompt the user to select whether a CATV system is being used or an antenna as the source of television signals.

If the television (or user, as the case may be) determines that cable is being used as the television signal input, the factory default settings (e.g. control voltage) for the subject electronically adjustable RF filter are used, block 156. As indicated above, the settings for the electronically adjustable RF filter are based on the good 75 ohm CATV cabling system. If the television (or user, as the case may be) determines that an antenna (air) is being used as the television signal input, the method 150 moves to block 158.

In block 158, the located television channels are recorded or stored in a channel list. Additionally, an approximate signal level (depending on whether the television signals are analog, NTSC, or digital, ATSC) based on a signal level parameter such as AGC settings, and/or signal quality, for each television channel is stored. Then in block 160, a television channel is tuned in the air (antenna) mode. The television channel chosen is according to selection typically by the user. In block 162, the signal level of the television channel as tuned is assessed. Such assessment is by measuring a parameter of the signal. A parameter of the signal may be its corresponding AGC value in the case of an analog signal, and signal quality in the case of a digital signal. This value (or these values) is/are stored for reference. Additionally, according to the channel list, the proximity of television channels adjacent the selected and tuned television channel are identified. The parameter values of these are also stored or imaged.

When the user selects a desired channel, the information for the desired channel is first retrieved, including the information regarding its assessment of signal parameters as indicated above. The processor in the television also looks to determine if additional signals near the desired signal are available. The method for this may involve a number of key parameters that may depend on the design of the tuner for instance, but one method may involve looking only for adjacent or second adjacent channels present. In any case, these assessments are then used in order to provide an aid to the "tuning" of the input filter by providing some indication of an error occurrence in the algorithm. In a particular instance, the "retuning" may begin to center the input filter on the adjacent channel and depending on various signal levels may provide a reading of desired signal assessment that is in error due to the presence of the adjacent channel. In this way the storage of signal assessments for each signal received can aid in the improvement of the desired signal tuning.

In block 164, the subject input filter is then adjusted for a better signal. This is accomplished by changing the voltage control signal to the filter and/or by providing a boost control signal. Such voltage control signal adjusts the frequency response of the input filter. A change in frequency response affects the center frequency of passband frequencies and/or a passband frequency range upwards or downwards as the case may be. Thereafter, in block 166, the narrow band AGC (NBAGC), the wide band AGC (WBAGC) and/or the signal quality (signal parameter values) are measured again with respect to the tuned television channel and assessed or compared to the previously stored values (signal parameter values).

The analysis of the narrow band and the wide band parameter values are preferably necessary in order to make sure that the energy of adjacent channels are not falsely perceived as coming from the channel being tuned. The narrow band and wide band values are thus analyzed with respect to the knowledge of which television channels are available and adjacent to the television channel being tuned.

As indicated in block 168, the adjustment process is repeated in both the upwards and downwards positions until the signal parameter values indicates an optimal condition for the tuned channel is achieved or adjustment range conditions are met. Thereafter, the new filter settings are stored. In one embodiment, a DAC (digital to analog converter) is utilized to provide the control voltage to the subject input filter and an EEPROM is used to store the settings. Each channel may have its own voltage value.

If the control voltage signal is semi-independent of the local oscillator, the voltage control value may be stored as an offset to the nominal voltage control value and applied as necessary. If the control voltage signal is independent of the local oscillator, the voltage value is stored and provided to the control voltage generator as appropriate.

The subject invention expands the capability of an RF receiver, particularly one using at least one electronically adjustable RF filter at the input of a tuner, by allowing the receiver to adjust the input filter center frequency in response to the presence of unexpected impedance present at the antenna input. In one form, the subject invention utilizes an algorithm for determining the necessary adjustment, with the algorithm getting its inputs from a source such as the AGC system, a digital signal level meter downstream in the receiver, or the like depending, in part, on whether the RF signal is analog or digital. Adjustment may be in the form of frequency response modification, such as adjustment of the center frequency and/or passband frequency range.

As a recapitulation, the subject invention takes advantage of the ability to adjust the RF input filter dynamically in the field based on the actual input impedance presented by the antenna and cable used. The subject RF input filter is nominally designed for operation at 75 ohms input. This is the default setting and it is also the setting to use for cable (CATV) reception. However, if off-air reception (antenna) is selected as the RF signal input, a performance improvement may be possible through adjustment of the input filter based on the antenna used. In this case, the tuner is still set for nominal conditions when first tuned. The performance measurements on RF AGC are determined as well as determining signal quality. If the indication from these measurements show that an improvement may be desirable, then the input filter control voltage is adjusted in each direction away from nominal (up or down in frequency) and the improvement monitored. Once the adjustment is complete, the new control voltage value can be stored in a separate memory location to be retrieved for future channel selections. Provisions will also allow for re-adjustment in the case where a different antenna or configuration becomes employed.

It has been determined through testing, that the adjustment range does not have to be very large and can also be artificially restricted to prevent a "trapping" condition. The monitoring system includes the determination of signal environment to detect the presence of adjacent channels in order to keep from optimizing on the wrong signal. Additionally, while using the AGC value has been indicated herein as the preferred detection method for movement, it should be appreciated that other metrics such as signal quality (digital signals), pix to sound ratio, and the like may be utilized.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and which fall within the limits of the appended claims.

The invention claimed is:

1. An electronically tunable input filter for a television channel tuner, comprising:

an input adapted to receive a television signal from an antenna;

an output adapted to provide a filtered television signal;

a first varactor connected at the output;

a second varactor coupled in series with the input and the first varactor;

a third varactor coupled to the input and ground; and an electronically tunable inductor coupled to ground and between the first and second varactor;

the electronically tunable inductor operative to receive an inductor control voltage for causing a passband frequency bandwidth of the electronically tunable input filter to encompass an expected frequency of the television channel to be tuned; and the second and third varactors operative to receive a first control voltage for adjusting the passband frequency bandwidth of the electronically tunable input filter.

2. The filter of claim 1, wherein the first control voltage is applied to the third varactor through a voltage scaling circuit that is operative to provide a fixed increase in the passband frequency bandwidth of the electronically tunable input filter upon receipt of a scaling signal.

3. The filter of claim 1, wherein the third varactor is operative to receive a second control voltage for adjusting the passband frequency bandwidth of the electronically tunable input filter in conjunction with the first control voltage applied to the second varactor.

4. The filter of claim 3, wherein the second control voltage is applied to the third varactor through a voltage scaling circuit that is operative to provide a fixed increase in the passband frequency bandwidth of the electronically tunable input filter upon receipt of a scaling signal.

* * * * *

UNITED STATES PATENT AND TRADEMARK OFFICE
CERTIFICATE OF CORRECTION

PATENT NO.      : 7,668,519 B2                           Page 1 of 1
APPLICATION NO. : 10/512525
DATED           : February 23, 2010
INVENTOR(S)     : Pugel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1333 days.

Signed and Sealed this

Seventh Day of December, 2010

David J. Kappos
*Director of the United States Patent and Trademark Office*